United States Patent [19]

Papathomas

[11] Patent Number: 5,468,790
[45] Date of Patent: Nov. 21, 1995

[54] TRIAZINE POLYMER AND USE THEREOF

[75] Inventor: Konstantinos I. Papathomas, Endicott, N.Y.

[73] Assignee: International Business Machines Corporation, Armonk, N.Y.

[21] Appl. No.: 304,826

[22] Filed: Sep. 13, 1994

Related U.S. Application Data

[62] Division of Ser. No. 997,964, Dec. 29, 1992, abandoned.

[51] Int. Cl.$^6$ .............................. C08K 5/34; C08G 73/06
[52] U.S. Cl. .................... 524/100; 524/101; 528/422; 528/423
[58] Field of Search .................. 257/778, 779; 508/422, 423; 524/100, 101

[56] References Cited

U.S. PATENT DOCUMENTS

| | | | |
|---|---|---|---|
| 3,382,221 | 5/1968 | Petropoulos et al. | |
| 4,086,204 | 4/1978 | Cassandrini et al. | 544/182 |
| 4,310,641 | 1/1982 | Ohmura et al. | 525/419 |
| 4,456,712 | 6/1984 | Christie et al. | 523/439 |
| 4,496,695 | 1/1985 | Sugio et al. | 525/391 |
| 4,604,644 | 8/1986 | Beckham et al. | |
| 4,623,577 | 11/1986 | Hsieu et al. | 428/209 |
| 4,690,962 | 9/1987 | Clark et al. | 524/14 |
| 4,742,118 | 5/1988 | Parekh | 428/425.8 |
| 4,745,215 | 5/1988 | Cox et al. | 428/422.8 |
| 4,776,904 | 10/1988 | Charlten et al. | 435/805 |
| 4,918,148 | 4/1990 | Meyer et al. | 525/424 |
| 4,999,699 | 10/1993 | Christie et al. | 257/778 |
| 5,015,719 | 5/1991 | Papathomas et al. | 428/408 |
| 5,045,922 | 9/1991 | Kodama et al. | 257/698 |
| 5,065,227 | 11/1991 | Frankeny et al. | 257/778 |
| 5,089,440 | 2/1992 | Christie et al. | 437/209 |
| 5,089,660 | 2/1992 | Murray et al. | 560/301 |
| 5,121,190 | 6/1992 | Hsiao et al. | 257/786 |
| 5,167,674 | 12/1992 | Ika | 526/262 |
| 5,194,930 | 3/1993 | Papathomos et al. | 252/773 |
| 5,276,106 | 1/1994 | Portelli et al. | 525/423 |
| 5,368,922 | 11/1994 | Portelli et al. | 428/229 |
| 5,405,686 | 4/1995 | Portelli et al. | 428/229 |

FOREIGN PATENT DOCUMENTS

| | | |
|---|---|---|
| 775188 | 1/1968 | Canada. |
| 0189791A2 | 8/1986 | European Pat. Off.. |
| WO89/06647 | 7/1989 | WIPO. |

OTHER PUBLICATIONS

Spaulding, et al., Coating Material, IBM Technical Disclosure Bulletin, vol. 13, No. 4 (1970), p. 825.

*Primary Examiner*—P. Hampton-Hightower
*Attorney, Agent, or Firm*—Pollock, Vande Sande & Priddy

[57] ABSTRACT

Triazine polymers are obtained reacting (a) monocyanate; and (b) dicyanate and/or prepolymers thereof. The polymers are useful in forming interconnection structures for forming an integrated semiconductor device to a carrier substrate.

16 Claims, 2 Drawing Sheets

TRIAZINE POLYMER AND USE THEREOF

This application is a division of Ser. No. 07/997,964, filed on Dec. 29, 1992, now abandoned.

TECHNICAL FIELD

The present invention is concerned with compositions that are useful in interconnection structures for joining an integrated semiconductor device to a carrier substrate of organic or ceramic nature and particularly to compositions that prior to curing are of low viscosity. The present invention is especially concerned with so-called "controlled collapse chip connection" or "C4" that employs solder-bump interconnections. Such is also referred to as the face down or flip-chip bounding. The present invention is also concerned with a method of making the interconnection structure.

BACKGROUND ART

Controlled collapse chip connection (C4) or flip-chip technology has been successfully used for over twenty years for interconnecting high I/O (input/output) count and area array solder bumps on the silicon chips to the base ceramic chip carriers, for example alumina carriers. The solder bump, typically a 95 Pb/5 Sn alloy, provides the means of chip attachment to the ceramic chip carrier for subsequent usage and testing. For example, see U.S. Pat. Nos. 3,401,126 and 3,429,040 to Miller and assigned to the assignee of the present application, for a further discussion of the controlled collapse chip connection (C4) technique of face down bonding of semiconductor chips to a carrier. Typically, a malleable pad of metallic solder is formed on the semiconductor device contact site and solder joinable sites are formed on the chip carrier.

The device carrier solder joinable sites are surrounded by non-solderable barriers so that when the solder on the semiconductor device contact sites melts, surface tension of the molten solder prevents collapse of the joints and thus holds the semiconductor device suspended above the carrier. With the development of the integrated circuit semiconductor device technology, the size of individual active and passive elements have become very small, and the number of elements in the device has increased dramatically. This results in significantly larger device sizes with larger number of I/O terminals. This trend will continue and will place increasingly higher demands on device forming technology. An advantage of solder joining a device to a substrate is that the I/O terminals can be distributed over substantially the entire top surface of the semiconductor device. This allows an efficient use of the entire surface, which is more commonly known as area bonding.

Usually the integrated circuit semiconductor devices are mounted on supporting substrates made of materials with coefficients of expansion that differ from the coefficient of expansion of the material of the semiconductor device, i.e. silicon. Normally the device is formed of monocrystalline silicon with a coefficient of expansion of $2.6 \times 10^{-6}$ per °C. and the substrate is formed of a ceramic material, typically alumina with a coefficient of expansion of $6.8 \times 10^{-6}$ per °C. In operation, the active and passive elements of the integrated semiconductor device inevitably generate heat resulting in temperature fluctuations in both the devices and the supporting substrate since the heat is conducted through the solder bonds. The devices and the substrate thus expand and contract in different amount with temperature fluctuations, due to the different coefficients of expansion. This imposes stresses on the relatively rigid solder terminals.

The stress on the solder bonds during operation is directly proportional to (1) the magnitude of the temperature fluctuations, (2) the distance of an individual bond from the neutral or central point (DNP), and (3) the difference in the coefficients of expansion of the material of the semiconductor device and the substrate, and inversely proportional to the height of the solder bond, that is the spacing between the device and the support substrate. The seriousness of the situation is further compounded by the fact that as the solder terminals become smaller in diameter in order to accommodate the need for greater density, the overall height decreases.

The disclosure of an improved solder interconnection structure with increased fatigue life can be found in U.S. Pat. No. 4,604,644 to Beckham, et al. and assigned to the assignee of the present application, disclosure of which is incorporated herein by reference. In particular, U.S. Pat. No. 4,604,644 discloses a structure for electrically joining a semiconductor device to a support substrate that has a plurality of solder connections where each solder connection is joined to a solder wettable pad on the device and a corresponding solder wettable pad on the support substrate, dielectric organic material disposed between the peripheral area of the device and the facing area of the substrate, which material surrounds at least one outer row and column of solder connections but leaves the solder connections in the central area of the device free of dielectric organic material.

The preferred material disclosed in U.S. Pat. No. 4,604,644 is obtained from a polyimide resin available commercially and sold under the trademark AI-10 by Amoco Corporation. AI-10 is formed by reacting a diamine such as p,p' diaminodiphenylmethane with a trimellitic anhydride or acylchloride of trimellitic anhydride. The polymer is further reacted with γ-amino propyl triethoxy silane (A-1100) or β-( 3,4-epoxy cyclohexyl) ethyltrimethoxy silane (A-186) from Dow Corning. The coating material is described in *IBM Technical Disclosure Bulletin*, September 1970, p. 825.

The dielectric material is typically applied by first mixing it with a suitable solvent and then dispensing it along the periphery of the device where it can be drawn in between the device and substrate by capillary action.

Encapsulants that exhibit, among other things, improved fatigue life of C4 solder connections are disclosed in U.S. Pat. No. 4,999,699 to Christie et al. and assigned to the assignee of the present invention, disclosure of which is incorporated herein by reference. In particular, U.S. Pat. No. 4,999,699 discloses a curable composition containing a binder which is a cycloaliphatic polyepoxide and/or a cyanate ester or prepolymer thereof and a filler. The cycloaliphatic polyepoxide, cyanate ester and cyanate ester prepolymer employed have viscosities at normal room temperatures (25° C.) of no greater than about 1,000 centipoise. The filler has a maximum particle size of 31 microns and is substantially free of alpha particle emissions. The amount of binder (i.e.-epoxy and/or cyanate ester) is about 60 to about 25 percent by weight of the total of the binder and filler and, correspondingly, the filler is about 40 to about 75 percent by weight of the total of the binder and filler.

In addition, U.S. Pat. No. 5,121,190 to Hsiao et al. and assigned to the assignee of the present application, disclosure of which is incorporated herein by reference, discloses providing C4 solder connections of an integrated semiconductor device on an organic substrate. The compositions disclosed therein are curable compositions containing a thermosetting binder and filler. The binder employed has viscosity at normal room temperatures (25° C.) of no greater than about 1,000 centipoise. Suitable binders disclosed therein include polyepoxides, cyanate esters and prepolymers thereof.

The technique disclosed therein enables chips to be attached directly on the surface of a board thereby eliminating an intermediate chip carrier.

Although the above techniques discussed in U.S. Pat. Nos. 4,999,699 and 5,121,190 have been quite successful, there still remains room for improvement, especially with respect to relatively low temperature processability.

SUMMARY OF INVENTION

The present invention is concerned with compositions that are curable at relatively low temperatures (about 200° C. or less) and exhibit excellent thermal stability along with relatively low coefficients of thermal expansion. The compositions of the present invention are especially useful in achieving fatigue life enhancement of the C4 solder connections of an integrated semiconductor device on a substrate.

The present invention provides a composition that exhibits excellent wetting and coverage of the C4 connections as well as the pin heads under the device that are present. In fact, the present invention makes it possible to achieve complete coverage beneath the chip. The compositions of the present invention prior to curing are of relatively low viscosity and thereby exhibit even and adequate flow under the semiconductor device.

The compositions of the present invention include a triazine polymer that is a reaction product of (a) monocyanate; and (b) dicyanate and/or a prepolymer thereof.

The present invention is also concerned with solder interconnection for forming connections between an integrated semiconductor device and a carrier substrate. The solder interconnection includes a plurality of solder connections that extend from the carrier substrate to electrodes on the semiconductor device to form a gap between the carrier substrate and the semiconductor device. The gap is filled with a composition obtained from curing the above disclosed composition.

Furthermore, the present invention is concerned with a method of sealing soldered interconnections between a semiconductor device and a supporting substrate. The method includes attaching the device to the substrate by a plurality of solder connections that extend from the supporting substrate to electrodes on the semiconductor device to form a gap between the supporting substrate and the semiconductor device. The above disclosed composition is injected into the gap and the monocyanate and dicyanate and/or prepolymer thereof are cured to form a triazine.

BEST AND VARIOUS MODES FOR CARRYING OUT THE INVENTION

Figure 1:
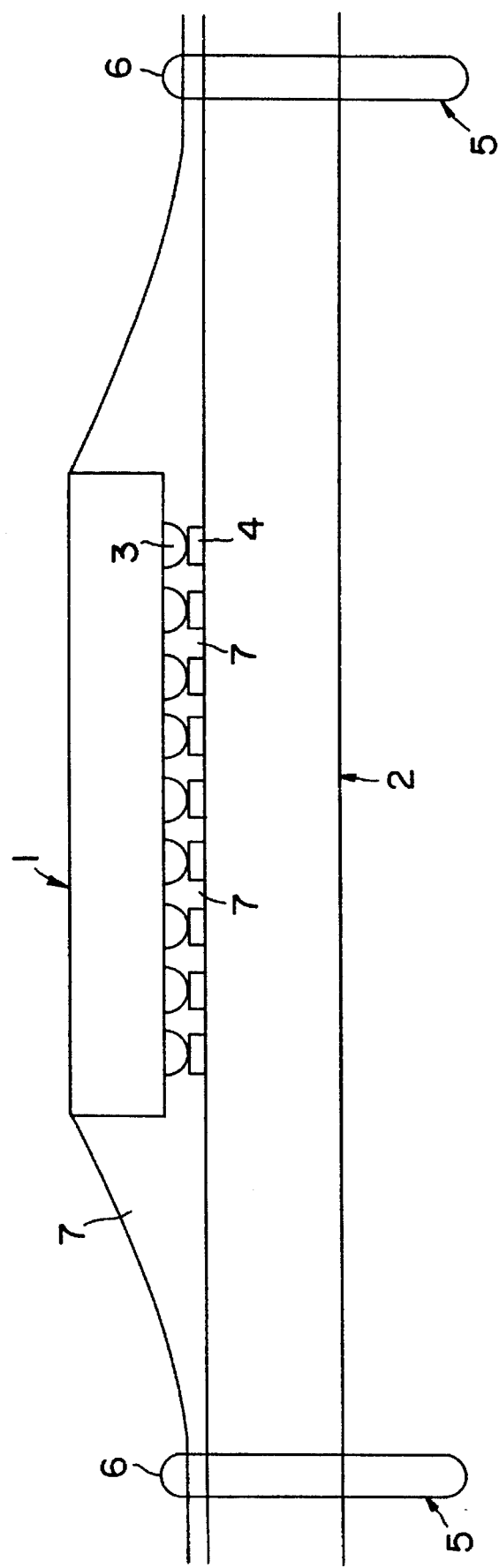
FIG. 1 is a schematic diagram of a solder interconnection pursuant to the present invention.

To facilitate an understanding of the present invention, reference is made to FIG. 1. In FIG. 1, numeral 1 represents a semiconductor chip joined on the chip carrier 2 by solder bumps 3 mated to pads 4. I/O pins 5 extend and protrude from the carrier 2, with a small portion 6 of the pins protruding from the other side of the carrier for carrying current thereto. When the carrier is an organic substrate, the pins (6) as such are not required. Instead, electrically conductive circuitry and interconnections would be provided such as at the periphery of substrate for connection to a desired structure. The sealant or encapsulant 7 pursuant to the present invention provides for essentially void free encapsulation of the solder connections thereby assuring highly reliable devices and fills the gap forming a uniform fillet around the chip as well as covering the pin heads under the device (not shown).

The triazine polymers of the present invention that are suitable for providing the sealant are reaction products of (a) monocyanate; and (b) dicyanate and/or prepolymers thereof.

The monocyanate is a monomeric monofunctional cyanate and include monocyanates represented by the following formula:

NCO—B wherein B represents an alkyl group; alkyl substituted phenyl ring; or a moiety of the formula:

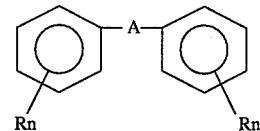

wherein A represents a single bond,

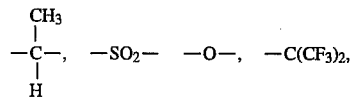

divalent alkylene radicals such as —CH$_2$— and —C(CH$_3$)$_2$—; divalent alkylene radicals interrupted by heteroatoms in the chain such as O, S and N. Each R is independently selected from the group of hydrogen, and alkyl containing 1 to 9 carbon atoms. Each n is independently an integer of 0 to 5.

Suitable alkyl groups for B and for substitution on a phenyl ring typically contain 1 to 16 carbon atoms, and preferably 1 to 9 carbon atoms.

Examples of suitable monocyanates are nonylphenyl cyanate; dinonyl phenyl cyanate, cumyl phenyl cyanate; phenyl cyanate, 2-,3-, or 4-methyl-, ethyl-, n-propyl-, isopropyl-, n-butyl-, isobutyl-, tert-butyl-, n- or iso-pentyl-, n or isohexyl-, n- or isoheptyl-, n-or isooctyl-, n- or isononyl-, n- or isodecyl-, ethene-, propene-, butene- and ethinphenylcyanate, 2,3- 2,4-, 2,5-, 2,6-, 3,4-, 3,5-dimethyl-, diethyl-, dipropylphenylcyanates; 2,3,4-, 2,3,5-, 2,3,6-, 3,4,5-, 2,4,6-trimethyl-, triethyl- and tripropylphenylcyanates; 2,3,4,6-, 2,3,4,5-, 2,3,5,6-tetramethyl-, tetraethyl- and tetrapropylphenylcyanates and 2,3,4,5,6-penta methylphenyl cyanates. The above mentioned alkyl radicals also can be mixed, e.g. 2,6-dimethyl 4-tert-butyl phenyl cyanate.

Other monocyanates include cycloalkylphenyl cyanates, for instance 2-, 3- or 4-cyclohexylphenylcyanate, substituted alkylphenyl cyanates, for instance 4-chloromethyl-, 4-hydroxy methyl-, and 3-trifluoromethylphenyl cyanate; aralkylphenylcyanates, for instance 2-, 3- or 4-phenylcyanates, halogenophenyl cyanates, for instance 2-, 3-, or 4-chloro- or bromophenylcyanate, 2,3-, 2,4-, 2,5-, 2,6-, 3,4-, 3,5-dichloro (bromo)-phenyl cyanate, 2-methyl-5-chloro-, 2-methyl-6-chloro-, 3-methyl-4-chloro-, 5-methyl-2-chloro-, 2-methyl-4-chloro-, 2 methyl-3-chlorophenylcyanate, nitrophenyl cyanates, alkyloxy, aryloxy-, acyloxy phenylcyanates, phenycyanates with S-containing substituents, for instance 2-, 3- or 4-methyl mercapto-ethylmercapto-, propylmercapto, phenymercapto-, acetylmercapto-, benzoylmercaptophenyl cyanates, 3- or 4-rhodanophenylcyanates, 2,4-bismethylmercapto- 3-methylphenylcyanate, cyanates from carboxylic aromatic esters other than phenyl; α- or β-naphthylcyanates, cyanates from heterocyclic systems, for instance 3-, 5-, 6-, 7- or 8-cyanatoquinoline 1-, 2-, 3- or 4-cyanatocarbazol, carboxylic acid, 5-cyanato-1-phenyl-3-methylpyrazole, 4-, 5-, 6-, or 7-cyanatobenztriazol, -benzthiazol, -benzimidazol-benzpyrazole.

The monocyanates can be prepared from the corresponding phenol analogs by reacting with a cyanogen halide such as cyanogen bromide in the presence of base catalyst such as triethylamine.

The dicyanate esters are curable through cyclotrimerization and can be monomeric or less desirably prepolymers, including oligomers and can be represented by those materials containing the following formula:

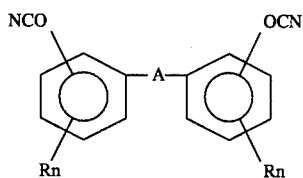

wherein A represents independently a single bond,

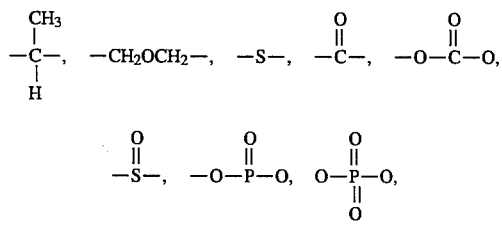

—$SO_2$—, —O—, —$C(CF_3)_2$—, divalent alkylene radicals such as —$CH_2$— and —$C(CH_3)_2$—; divalent alkylene radicals interrupted by heteroatoms in the chain such as O, S and N.

Each R is independently selected from the group of hydrogen, alkyl containing 1 to 9 carbon atoms:

Each n independently is an integer of 0 to 4. Other polyfunctional cyanates are prepared by well known methods, for example, by reacting the corresponding polyvalent phenol with a halogenated cyanate as exemplified in U.S. Pat. Nos. 3,553,244, 3,740,348 and 3,755,402.

Examples of the polyfunctional cyanate ester include 1,3- or 1,4-dicyanatobenzene; 1,3,5-tricyanatobenzene; 1,3-, 1,4-, 1,6-, 1,8-, 2,6-, or 2,7-dicyanatonaphthalene; 1,3,6-tricyanatonaphthalene; 4,4'-dicyanatonaphthalene; bis(4-cyanatophenyl)propane; 2,2-bis(3,5-dichloro-4-cyanatophenyl)propane; bis(4-cyanatophenyl)ether; bis(4-cyanatophenyl)thioethers, bis(4-cyanatophenyl)sulfone; tris-(4-cyanatophenyl)phosphite; tris(4-cyanatophenyl)phosphate; bis(3-chloro-4-cyanatophenyl)methane; cyanated novolak derived from novolak, cyanated bisphenol type polycarbonate oligomer derived from bisphenol type polycarbonate oligomer, and mixture thereof. Other cyanate esters employed in the practice of this invention are listed in the U.S. Pat. Nos. 3,553,244; 3,740,348; 3,755,402; 3,562,214; British Patent No. 1,060,933; Japanese patent publication (Kohkoku) Nos. 18468/1968; British Patent Nos. 1,218,447 and 1,246,747 and U.S. Pat. No. 3,994,949 and Japanese Patent Publication (Kohkai) No. 26853/1972 which are incorporated herein for reference.

Also, specific cyanate esters that can be employed in the present invention are available and well-known and include those discussed in U.S. Pat. Nos. 4,195,132; 3,681,292; 4,740,584; 4,745,215; 4,477,629; and 4,546,131; European patent application EP0147548/82; and German Offen. 2,611,796, disclosures of which are incorporated herein by reference.

An example of a suitable polyaromatic cyanate ester containing cycloaliphatic bridging group between aromatic rings is available from Dow Chemical Company under the designation "Dow XU-71787 cyanate. A discussion of such can be found in Bogan, et al., "Unique Polyaromatic Cyanate Ester for Low Dielectric Printer Circuit Boards", *Sampe Journal*, Vol. 24, No. 6, November/December 1988. A specific polyfunctional cyanate ester is Bisphenol AD dicyanate (d,d'-ethylidene bisphenol dicyanate) available from Ciba-Geigy under the trade designation AROCY L-10.

When prepolymers of the dicyanate are employed such typically have conversions of up to about 30% and more typically of up to about 15%.

The amount of the monocyanate is typically about 5 to about 50%, and preferably about 5 to about 40% and most preferably about 5 to about 30% by weight of the total of the monocyanate and dicyanate and/or prepolymer thereof.

The amount of the dicyanate and/or prepolymer thereof is correspondingly about 50 to about 95% by weight, preferably about 60 to about 95% by weight, and most preferably about 95 to about 70% by weight of the total of the monocyanate and dicyanate and/or prepolymers thereof.

Compositions of the present invention can also include a filler and especially an inorganic filler. The particular size of the filler is typically not greater than about 49 microns or less, preferably about 0.7 to about 40 microns. This is desirable so that the compositions will have the desired CTE and viscosity characteristics and readily flow in the gap between the chip and substrate carrier. The gap is normally about 25 to about 160 microns and preferably about 75 to about 125 microns. The preferred fillers have average particle size of about 5 to about 25 microns.

In addition, the filler should be at least substantially free of alpha particular emissions such as from the trace amounts of radioactive impurities such as uranium and thorium normally present in conventional silica or quartz fillers. The fillers employed have emission rates of less than 0.01 alpha particles/$cm^2$-hr and preferably less 0.005 alpha particles/$cm^2$-hr. The presence of alpha particle emissions primarily caused by the presence of uranium and thorium isotopes in the fillers can generate electron/hole pairs which in turn would be detrimental to the device. The preferred filler is high purity fused or amorphous silica. A commercially available filler that can be employed is DP4910 from PQ Corporation. The preferred filler can be optionally treated with a coupling agent.

The compositions of the present invention contains about 30 to about 50% by weight and preferably about 40% by weight of the binder and correspondingly about 70% to about 50% by weight and preferably about 55% by weight of the filler. These amounts are based upon the total amounts of binder and filler in the composition.

In addition to the binder and filler, the compositions can also include a catalyst to promote the polymerization of the cyanate ester mixture. Suitable catalysts for the cyanate ester include Lewis acids, such as aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, iron, zinc, manganese and copper acetylacetonate or octoates or naphthenates. The amount of catalyst when used can vary, and generally will be 0.005 to 5 weight percent, preferably 0.05 to 0.5 weight percent based on total solid binder weight.

Surfactants in amounts of about 0.5% to about 3% and preferably about 1% to about 1.4% can be used to facilitate flow of the compositions. Suitable surfactants include silanes and non-ionic type surface active agents.

Especially preferred are the non-ionic alkylphenyl polyether alcohols including those available under the trade designation Triton from Rohm & Haas Co. These surface active agents are prepared by the reaction of octylphenol or nonylphenol with ethylene oxide and have the following general structural formula, respectively:

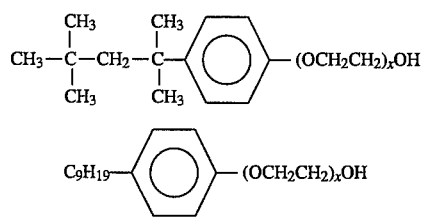

in which the alkyl group is a mixture of branched-chain isomers and x is the average number of ethylene oxide units in the ether side chain. Products of the above series of compounds include:

| | Octylphenol Series | |
|---|---|---|
| Triton | x-15 | x = 1 |
| Triton | x-35 | x = 3 |
| Triton | x-45 | x = 5 |
| Triton | x-114 | x = 7–8 |
| Triton | x-100 | x = 9–10 |
| Triton | x-102 | x = 12–13 |
| Triton | x-165 | x = 16 |
| Triton | x-305 | x = 30 |
| Triton | x-405 | x = 40 |
| Triton | x-705-50% | x = 70 |
| Triton | x-705-100% | x = 70 |
| | Nonylphenol Series | |
| Triton | n-17 | x = 1.5 |
| Triton | n-42 | x = 4 |
| Triton | n-57 | x = 5 |
| Triton | n-60 | x = 6 |
| Triton | n-87 | x = 8.5 |
| Triton | n-101 | x = 9–10 |
| Triton | n-111 | x = 11 |
| Triton | n-150 | x = 15 |
| Triton | n-101 | x = 40 |

The preferred compositions of the present invention also include an organic dye in amounts less than about 0.2% to provide contrast. Suitable dyes are nigrosine and Orasol blue GN.

The preferred compositions of the present invention are substantially free (e.g.—less than 0.2% by weight) if not completely free from non-reactive organic solvents.

Compositions employed pursuant to the present invention have viscosity at 25° C. (Brookfield cone & plate Spindle 51, 20 RPM or equivalent) of about 2,000 to about 30,000 centipoise and preferably about 2,000 to about 20,000 centipoise. The compositions can be cured at temperatures of about 180° C. to about 200° C. in about 1 to about 2 hours and preferably about 1.5 hours. The compositions when cured have alpha particle emissions of less than about 0.005 preferably less than about 0.004 counts/cm$^2$-hr and most preferably less than about 0.002 counts/cm$^2$-hr. The cured compositions also have coefficient of thermal expansion of about 24 ppm/°C. to about 38 ppm/°C., glass transition temperature of greater than about 125° C. and preferably about 140° C. to about 200° C. The cured compositions have Shore D hardness of greater than 90, modulus of elasticity at 25° C. of greater than 1.0 Mpsi and preferably greater than 1.2 Mpsi.

The compositions are prepared by rapidly admixing the components under vacuum usually about 5 mm Hg either using a double planetary mixer or high shear mixer under vacuum to provide better and homogenous compositions.

The composition is applied by dispensing through nozzles under pressure of about 20 to about 50 psi and temperatures of about 40° C. to about 80° C. The compositions completely cover the C4 connections and pin heads.

It is preferred that the substrates be at a temperature of about 65° C. to about 100° C. during the dispensing.

The compositions are then cured by heating to about 150° C. to about 200° C. for about 1 hour to about 3 hours and preferably about 1.5 hours to about 2.0 hours. The substrate employed can be an organic, inorganic or composite in nature. The preferred substrate can be a ceramic module or a multilayer printed circuit board. The preferred ceramic substrates include silicon oxides and silicates such as aluminum silicate, and aluminum oxides.

The organic substrates can be thermoplastic as well as thermosetting polymeric materials.

The preferred printed circuit board includes conventional FR-4 epoxy and laminates based on high temperature resins such as high temperature epoxies, polyimides, cyanates (trizines), fluoropolymers, benzocyclobutenes, polyphenylenesulfide, polysulfones, polyetherimides, polyetherketones, polyphenyquinoxalines, polybenzoxazoles, and polyphenyl benzobisthiazoles.

The polymers can be reinforced such as with glass, for instance epoxy-glass substrates. Also the substrates can be rigid or flexible. Suitable flexible substrates include the flexible polyimide substrates.

The following non-limiting examples are presented to further illustrate the present invention.

EXAMPLE 1

Preparation of dinonyl phenol cyanate (DNPC)

Dinonyl phenol-flashed is obtained from Texaco Chemical Company. It is a viscous liquid possessing a slight phenolic odor and is a mixture of dinonyl phenols, predominantly ortho-para-substituted. The nonyl groups are randomly branched. It is used in the synthesis of the cyanate ester with no further purification.

Distilled water (about 30 ml) and bromine (about 22 g) are introduced into a 500 ml three necked round-bottom flask equipped with a low temperature thermometer, mechanical stirrer, and a 100 ml pressure equalizing dropping funnel. The mixture is stirred rapidly and cooled to −5° C. in an ice-salt bath. Sodium cyanide (about 6.5 g) in water (about 30 ml) is then added drop-wise over a period of 30 min; the temperature is maintained below about 5° C. during the addition. The solution gradually turns bright yellow. After 15 min, dinonyl phenol, about 44.6 g in carbon tetrachloride (about 100 ml) is added all at once with vigorous stirring. Triethylamine (about 15 g) is then added over a period of about 30 min; the temperature is maintained below about 10° C. during the addition. The mixture is stirred for an additional 15 min. The organic layer is then separated, washed with water (2×100 ml), dried ($Na_2SO_4$), and concentrated. The resulting syrupy material is loaded on a short column of silica gel (about 150 g, in a sintered glass funnel) and the product eluted with hexane. The filtrate is concentrated to afford about 26 g (54%) of dinonyl phenol cyanate as a light yellow liquid. Positive identification is made by the absorption peak at 2266 $cm^{-1}$, which is characteristic of the OCN vibration.

EXAMPLE 2

Nonyl phenyl cyanate and p-cumyl phenyl cyanate are prepared from the corresponding phenol analogs according to the procedure described in example 1.

EXAMPLE 3

The Arocy L-10 monomer is obtained from Ciba Geigy as a liquid with a purity greater than 99.95%. Blends of Arocy L-10, containing up to 40 percent monocyanate i.e. (dinonyl (dinonyl phenol cyanate, nonyl phenyl or p-cumyl phenyl cyanate) are dissolved by simply mixing the two monomers in the appropriate amounts. The resulting mixtures are catalyzed with zinc octoate (100 ppm zinc metal). Zinc octoate is obtained from Mooney Chemicals, Cleveland, Ohio 44113 as an 8% (zinc metal) solution in mineral spirits.

Figure 2:
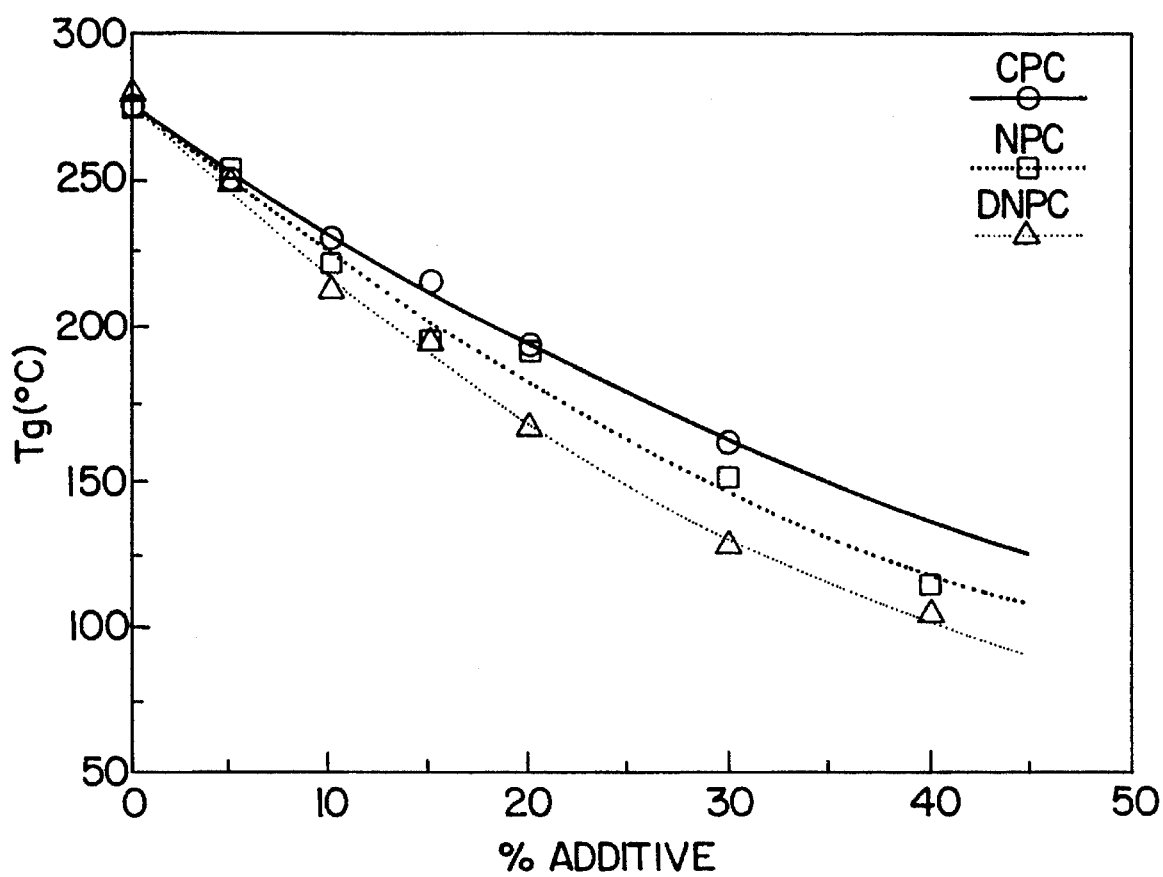
FIG. 2 illustrates glass transition temperature (Tg) of the cyanate blends pursuant to the present invention.

The glass transition temperature of each blend is determined using a DuPont 912 dual sample DSC, coupled to the 9900 Thermal Analyzer. The instrument is purged with nitrogen at a flow rate of less than 50 cc/min during each run. The sample size is approximately 8 mg and the heating rate is about 20° C./minute. Results are graphically presented in FIG. 2.

EXAMPLE 4

A composition containing about 80 parts by weight of bisphenol AD dicyanate available from Ciba-Giegy as Arocy L10, about 20 parts of dinonyl phenyl cyanate; about 145 parts by weight of fused silica (DP4910 from PQ Corporation) and having a particle size of 49 microns maximum and being free of alpha particle emissions; about 3 parts by weight of Triton X-100; about 0.1 parts by weight of the zinc octoate (8% zinc in mineral spirits); and about 0.1 parts by weight of nigrosine is prepared.

The composition is dispensed at a temperature of about 50° C. in the gap of about 5 mils between a silicon chip soldered by solder bumps to 28 mm by 28 mm $Al_2O_3$ substrate having pins protruding therefrom. The composition is cured at about 180° C. in about 2 hours. The composition has a coefficient of thermal expansion of less than $28\times10^{-6}/°C$.

The structures tested for fatigue life exhibit no failures upon thermocycling the test vehicles for over 5,000 cycles between 0° C. to 100° C. On the other hand, control test vehicles filled with prior art compositions show failures at about 2,000 cycles.

EXAMPLE 5

A liquid mixture containing about 67 parts by weight of bisphenol AD dicyanate available from Ciba-Giegy as Arocy L10; about 33 parts by weight of p-cumyl phenyl cyanate (from example 2); about 148 parts by weight of fused silica available under the trade name DP4910 from PQ Corporation; about 3 parts by weight of Triton X-100 (a non-ionic surfactant); about 0.1 parts by weight of manganese naphthenate and about 0.1 parts by weight of orasol Blue GN is prepared.

The composition is dispensed at a temperature of about 30° C. in the gap of about 5 mils between a silicon chip soldered by solder bumps to an FR-4 epoxy-glass substrate. The mixture covers the solder bumps and forms a fillet around the device. The composition is cured at about 170° C. in about 2 hours. The composition has a coefficient of thermal expansion of less than $30\times10^{-6}/°C$.

EXAMPLE 6

A liquid mixture containing about 70 parts by weight of bisphenol AD dicyanate available from Ciba-Giegy as Arocy L10; about 30 parts by weight of nonyl phenyl cyanate (from example 2); about 150 parts by weight of fused silica available under the trade name DP4910 from PQ corporation; about 2.5 parts by weight of Triton X-100; about 0.2 parts by weight of zinc octanoate and about 0.3 parts by weight of nigrosine is prepared.

The composition is dispensed at a temperature of about 60° C. in the gap of about 5 mils between a silicon device flip-chip bonded to a high Tq epoxy-glass substrate. The composition is cured at 170° C. in about 2 hours and forms a fillet around the silicon chip, on all four sides. The composition has a coefficient of thermal expansion of less than $28\times10^{-6}/°C$.

What is claimed:

1. A composition containing a triazine polymer that comprises a reaction product of (a) monocyanate; and (b) dicyanate, prepolymers thereof or mixtures thereof, wherein the amount of (a) is about 5 to about 50% by weight of the total of (a) and (b), and correspondingly, the amount of (b) is about 50% to about 95% by weight based upon the amount of (a) and (b); and filler having a maximum particle size of about 49 microns and being substantially free of alpha particle emissions; wherein the amount of the polymer is about 30% to about 50% by weight of the total of polymer and filler and correspondingly, the amount of filler is about 50% to about 70% by weight based upon the weight of polymer and filler.

2. The composition of claim 1 wherein the amount of (a) is about 5 to about 40% by weight of the total of (a) and (b), and correspondingly, the amount of (b) is about 60% to about 95% by weight based upon the amount of (a) and (b).

3. The composition of claim 2 wherein said monocyanate is selected from the group consisting of nonylphenyl cyanate; dinonyl phenyl cyanate, cumyl phenyl cyanate and mixtures thereof.

4. The composition of claim 3 wherein said dicyanate is 4,4'-ethylidene bisphenol dicyanate.

5. The composition of claim 1 wherein further includes about 0.5% to about 3% by weight of a surfactant.

6. The composition of claim 1 that exhibits a viscosity of 25° C. (Brookfield cone and plate spindle 51, 20 RPM or equivalent) of about 2000 to about 3000 centipoise and that is curable at about 200° C. or less.

7. The composition of claim 1 which further includes about 1% to about 1.4% by weight of a surfactant.

8. The composition of claim 1 wherein the amount of filler is about 55% by weight.

9. The composition of claim 1 wherein the viscosity at 25° C. is about 2000 to about 20,000 centipoise.

10. The composition of claim 1 wherein said filler is an inorganic filler selected from the group of silica, quartz and fused silica coated with coupling agents.

11. The composition of claim 1 wherein said filler has emission rate of less than 0.005 alpha particles/cm$^2$-hr.

12. The composition of claim 1 wherein said filler has particle sizes of about 0.5 to about 49 micrometers.

13. The composition of claim 1 which is free of unreactive organic solvents.

14. The composition of claim 1 which further includes a catalyst.

15. The composition of claim 5 wherein said surfactant is selected from the group consisting of silanes and non-ionic surface active agents.

16. The composition of claim 5 wherein said surfactant is a non-ionic alkylphenyl polyether alcohol.

* * * * *